US010889914B2

(12) United States Patent
Yang et al.

(10) Patent No.: US 10,889,914 B2
(45) Date of Patent: Jan. 12, 2021

(54) LOCATION-SPECIFIC GROWTH AND TRANSFER OF SINGLE CRYSTALLINE TMD MONOLAYER ARRAYS

(71) Applicant: THE TRUSTEES OF THE STEVENS INSTITUTE OF TECHNOLOGY, Hoboken, NJ (US)

(72) Inventors: Eui-Hyeok Yang, Fort Lee, NJ (US); Xiaotian Wang, Secaucus, NJ (US); Kyungnam Kang, Edgewater, NJ (US); Siwei Chen, Jersey City, NJ (US)

(73) Assignee: THE TRUSTEES OF THE STEVENS INSTITUTE OF TECHNOLOGY, Hoboken, NJ (US)

(*) Notice: Subject to any disclaimer, the term of this patent is extended or adjusted under 35 U.S.C. 154(b) by 101 days.

(21) Appl. No.: 16/273,601

(22) Filed: Feb. 12, 2019

(65) Prior Publication Data

US 2019/0256998 A1 Aug. 22, 2019

Related U.S. Application Data

(60) Provisional application No. 62/629,408, filed on Feb. 12, 2018.

(51) Int. Cl.
*C09J 7/00* (2018.01)
*C09J 5/00* (2006.01)
(Continued)

(52) U.S. Cl.
CPC ............. *C30B 25/04* (2013.01); *C09J 5/06* (2013.01); *C09J 7/35* (2018.01); *C23C 16/042* (2013.01);
(Continued)

(58) Field of Classification Search
CPC ......... C09J 7/00; C09J 7/30; C09J 7/35; C09J 5/00; C09J 5/06; C23C 16/00;
(Continued)

(56) References Cited

U.S. PATENT DOCUMENTS 9,620,665 B1 * 4/2017 Bartolucci ............. C23C 16/02
9,640,391 B2    5/2017 Yang et al.
(Continued)

OTHER PUBLICATIONS

"Graphine is not alone," Nature Nanotechnology, vol. 7, Issue 11, pp. 683 (2012).
(Continued)

*Primary Examiner* — Jacob T Minskey
*Assistant Examiner* — Matthew Hoover
(74) *Attorney, Agent, or Firm* — Lewis Roca Rothgerber Christie LLP; Ralph W. Selitto, Jr.; John K. Kim

(57) ABSTRACT

The exemplary embodiments describe techniques for a controlled chemical vapor deposition growth and transfer of arrayed TMD monolayers on predetermined locations, which enable the formation of single crystalline TMD monolayer arrays on specific locations. The unique growth process includes the patterning of transition metal oxide (e.g., $MoO_3$) on the source substrate contacting the growth substrate face-to-face, where the growth of single crystalline TMD monolayers with controlled size and location, exclusively on predetermined locations on the growth substrates is accomplished. These TMD arrays can be align-transferred using a unique process that combines the wet and stamping transfer processes onto any target substrate with a pin-point accuracy, which dramatically enhances the integrity of transferred TMDs.

20 Claims, 5 Drawing Sheets

(51) Int. Cl.

| | |
|---|---|
| *C23C 16/00* | (2006.01) |
| *C30B 25/00* | (2006.01) |
| *C30B 29/00* | (2006.01) |
| *G03F 7/00* | (2006.01) |
| *H01L 21/00* | (2006.01) |
| *C30B 25/04* | (2006.01) |
| *H01L 21/02* | (2006.01) |
| *H01L 21/78* | (2006.01) |
| *H01L 21/683* | (2006.01) |
| *C23C 16/04* | (2006.01) |
| *C23C 16/30* | (2006.01) |
| *C30B 25/18* | (2006.01) |
| *C30B 29/46* | (2006.01) |
| *C09J 5/06* | (2006.01) |
| *C09J 7/35* | (2018.01) |
| *H01L 21/20* | (2006.01) |

(52) U.S. Cl.
CPC .......... *C23C 16/305* (2013.01); *C30B 25/18* (2013.01); *C30B 29/46* (2013.01); *G03F 7/0015* (2013.01); *H01L 21/0262* (2013.01); *H01L 21/02381* (2013.01); *H01L 21/02422* (2013.01); *H01L 21/02488* (2013.01); *H01L 21/02568* (2013.01); *H01L 21/02639* (2013.01); *H01L 21/02642* (2013.01); *H01L 21/2007* (2013.01); *H01L 21/6835* (2013.01); *H01L 21/7813* (2013.01); *C09J 2203/326* (2013.01); *H01L 2221/68363* (2013.01)

(58) Field of Classification Search
CPC ....... C23C 16/04; C23C 16/042; C23C 16/30; C23C 16/305; C30B 25/00; B30B 25/04; B30B 25/10; B30B 25/18; B30B 29/00; B30B 29/40; B30B 29/46; G03F 7/00; G03F 7/001; G03F 7/0015; H01L 21/00; H01L 21/02; H01L 21/023; H01L 21/0238; H01L 21/02381; H01L 21/024; H01L 21/0242; H01L 21/02422; H01L 21/0248; H01L 21/02488; H01L 21/025; H01L 21/0256; H01L 21/02568; H01L 21/026; H01L 21/0262; H01L 21/0263; H01L 21/02639; H01L 21/0264; H01L 21/02642; H01L 21/20; H01L 21/2007; H01L 21/60; H01L 21/68; H01L 21/683; H01L 21/6835; H01L 21/70; H01L 21/78; H01L 21/781; H01L 21/7813
See application file for complete search history.

(56) References Cited

U.S. PATENT DOCUMENTS

| | | |
|---|---|---|
| 9,673,390 B2 | 6/2017 | Reed et al. |
| 2015/0064471 A1* | 3/2015 | Dresselhaus ........ C23C 16/0272 428/408 |
| 2016/0093689 A1* | 3/2016 | George ............ H01L 21/02568 257/76 |
| 2017/0101428 A1 | 4/2017 | Wang et al. |

OTHER PUBLICATIONS

Wang, et al., "Location-specific growth and transfer of arrayed MoS2 monolayers with controllable size", 2D Materials, 4, 025093 (2017).

Yang, et al. "Electrically tunable valley-light emitting diode (vLED) based on CVD-grown monolayer WS2," Nano Letters, 2016, vol. 16, Issue 3, pp. 1560-1567. DOI: 10.1021/acs.nanolett.5b04066, Feb. 8, 2016.

Zafar, et al., "Probing the intrinsic optical quality of CVD grown MoS2," Nano Research, May 2017, vol. 10, Issue 5, pp. 1608-1617. DOI 10.1007/s12274-016-1319-z, Nov. 8, 2016.

Han, et al., "Seeded growth of highly crystalline molybdenum disulphide monolayers at controlled locations," Nature communications, vol. 6, Article No. 6128 (2015), DOI: 10.1038/ncomms7128, Jan. 28, 2015.

Sun, et al. "Chemical vapor deposition growth of a periodic array of single-layer MoS2 islands via lithographic patterning of an SiO2/Si substrate," 2D Materials, vol. 2, Article 045014 (2015), Dec. 16, 2015.

Zhu, et al., "Excitonic Resonant Emission—Absorption of Surface Plasmons in Transition Metal Dichalcogenides for Chip-Level Electronic-Photonic Integrated Circuits," ACS Photonics 2016, vol. 3, Issue 5, pp. 869-874, DOI: 10.1021/acsphotonics.6b0010, Apr. 19, 2016.

Lee, et al., "Field-effect transistor with a chemically synthesized MoS2 sensing channel for label-free and highly sensitive electrical detection of DNA hybridization," Nano Research, Jul. 2015, vol. 8, Issue 7, pp. 2340-2350, DOI 10.1007/s12274-015-0744-8, May 9, 2015.

Shen, et al., "Strain Engineering for Transition Metal Dichalcogenides Based Field Effect Transistors," ACS Nano, 2016, vol. 10, Issue 4, pp. 4712-4718, DOI: 10.1021/acsnano.6b01149, Apr. 4, 2016.

Eda, et al., "Photoluminescence from Chemically Exfoliated MoS2," Nano Letters, 2011, vol. 11, Issue 12, pp. 5111-5116, DOI: 10.1021/nl201874w, Oct. 28, 2019.

Li et al., "Preparation and Applications of Mechanically Exfoliated Single-Layer and Multilayer MoS2 and WSe2 Nanosheets," Accounts of Chemical Research 2014, vol. 47, Issue 4, pp. 1067-1075.

* cited by examiner

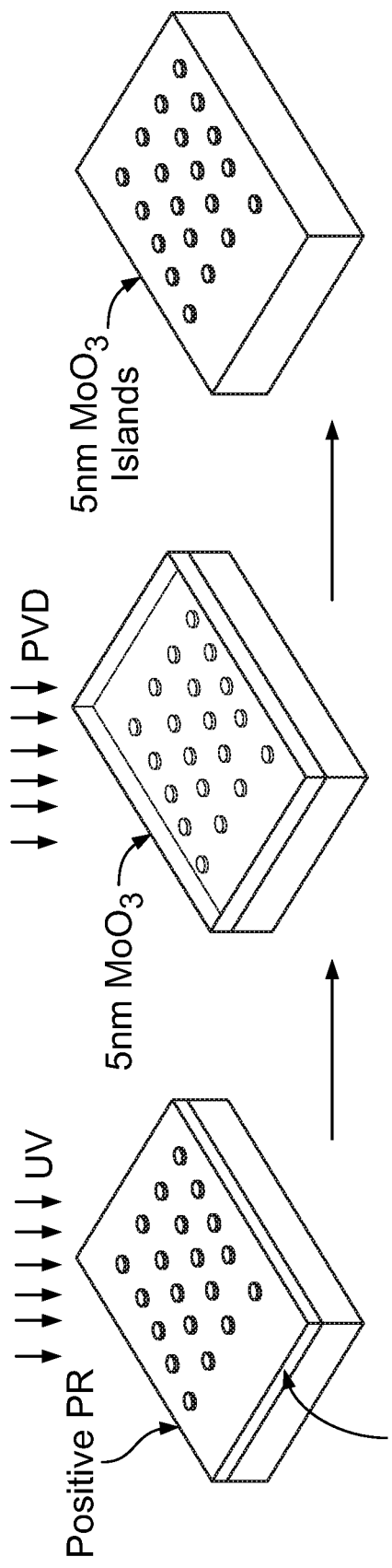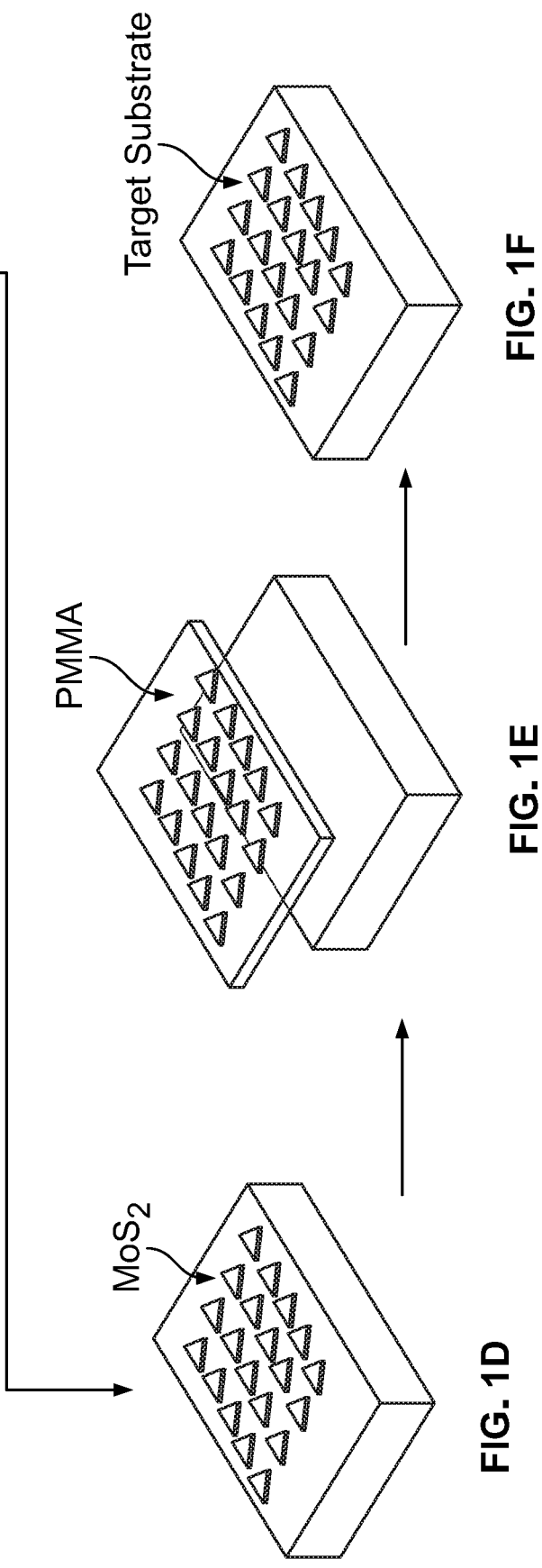

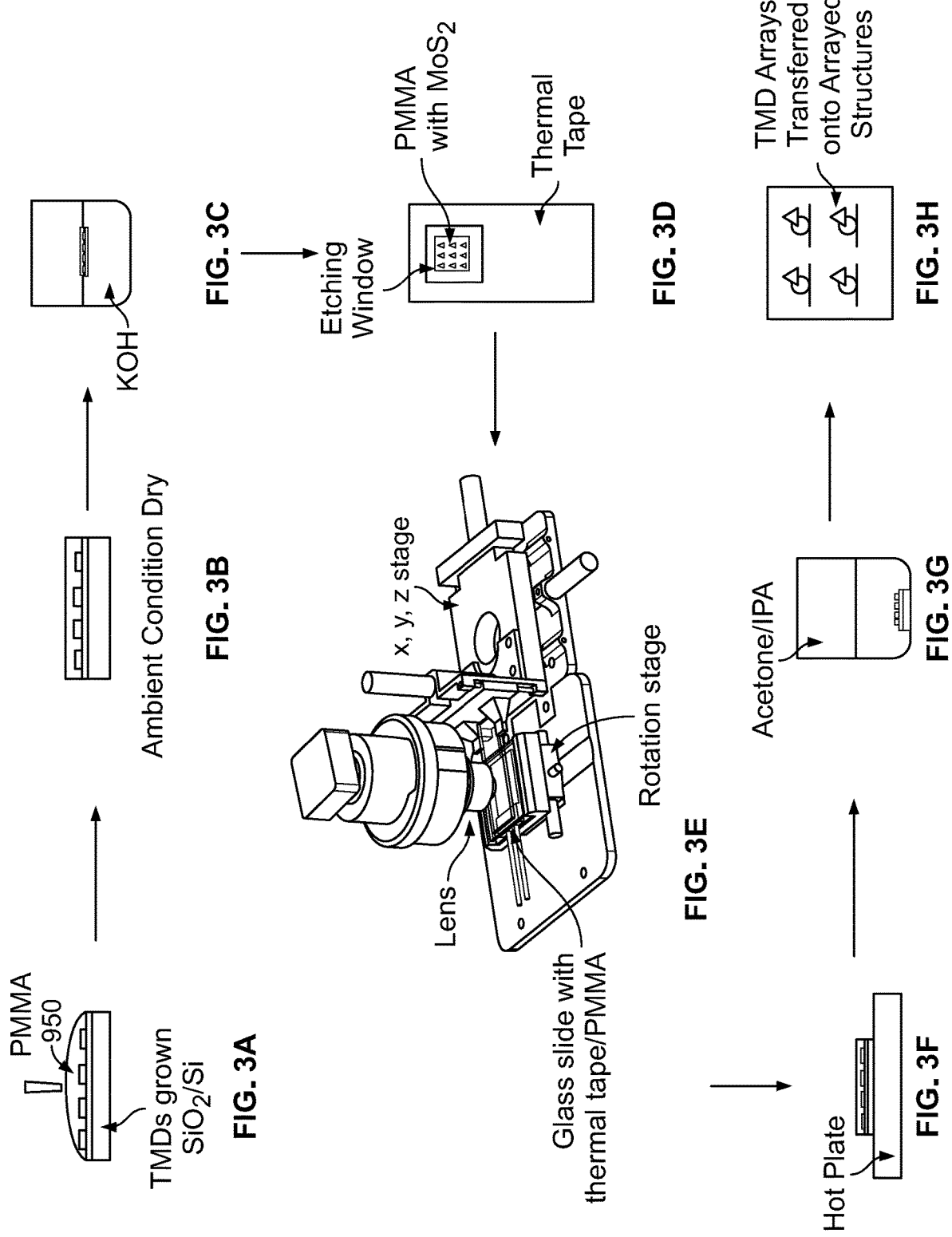

LOCATION-SPECIFIC GROWTH AND TRANSFER OF SINGLE CRYSTALLINE TMD MONOLAYER ARRAYS

CROSS-REFERENCE TO RELATED APPLICATION

This application claims priority to U.S. Provisional Patent Application Ser. No. 62/629,408 filed Feb. 12, 2018, the entire disclosure of which is incorporated herein by reference.

STATEMENT REGARDING FEDERALLY SPONSORED RESEARCH

This invention was made with government support under Grant Number 1104870 awarded by the National Science Foundation; Grant Number 1531237 awarded by the National Science Foundation; and Grant Number FA9550-12-1-0326 awarded by the United States Air Force Office of Scientific Research. The government has certain rights in the invention.

FIELD OF THE INVENTION

The present invention relates to the fabrication of two-dimensional (2D) transition metal dichalcogenides ("TMDs") and, more specifically, the growth and transfer of single crystalline TMDs on specific locations on a substrate.

BACKGROUND OF THE INVENTION

TMDs have recently emerged as core semiconducting materials for optoelectronic applications due to their attractive electrical and optical properties. Single crystalline TMD monolayers (e.g., $MoS_2$ and $WeS_2$), in particular, possess exotic optical nonlinearities that are orders of magnitude higher than what the best crystalline and amorphous materials could offer. Such strong nonlinearities, if exploited, may enable several optoelectronics-related applications, such as all-optical information processing and quantum computing with single photons, where the enormous advantages with optics and photonics information technology can be realized in practical settings.

However, typical chemical vapor deposition ("CVD") growth results in the growth of TMDs on substrates in an uncontrolled manner in terms of location and size which cannot be extended toward high-throughput fabrication. The controlled growth and transfer of the arrays of single crystalline TMD monolayers on specific locations of the same or a dissimilar substrate will open a new door toward next generation optoelectronics and photonics.

SUMMARY OF THE INVENTION

The present invention entails the unique growth of single crystalline TMD monolayer arrays and the aligned chip-scale transfer TMDs on specific locations on any substrate. The growth process involves patterning a source substrate with photoresist to form a patterned array, performing photolithography and lift-off processes to obtain a patterned film of transition metal oxide on the source substrate, soaking a growth substrate in potassium hydroxide, and performing chemical vapor deposition to form a first and second TMD layer, or film coating, on the two substrates, the layers being formed in accordance with the patterned film. The transfer process can be used to transfer the patterned film coating made via the growth process. The transfer process involves coating the growth substrate having a film coating with Poly(methylmetharcrylate) (PMMA) to form a chip; floating the chip in aqueous potassium hydroxide solution; retrieving a film product from the potassium hydroxide solution; attaching the film product to a thermal tape; aligning the film product with a desired microstructure of a target substrate using, for example, micromanipulation means; adhering the thermal tape to the target substrate; baking the target substrate; and soaking the target substrate in acetone to remove the thermal tape and Poly(methylmetharcrylate). These growth and transfer processes can be extended toward creating large-scale arrays of such monolayers, which is readily applicable to fabricate electronic and optoelectronic devices in high-throughput with fewer steps and less contamination.

BRIEF DESCRIPTION OF THE DRAWINGS

FIG. 1A. is a schematic diagram showing spin-coating and patterning photoresist on a 90 nm $SiO_2$ substrate;

FIG. 1B is a schematic diagram showing the deposition of 5 nm $MoO_3$ (1B) on the substrate of FIG. 1A;

FIG. 1C is a schematic diagram showing the $MoO_3$ dot arrays forming via a lift-off process;

FIG. 1D is a schematic diagram showing $MoS_2$ arrays grown on both the source and growth substrates following CVD;

FIG. 1E shows the transfer of $MoS_2$ arrays onto target substrates;

FIG. 1F shows the transfer of $MoS_2$ arrays onto target substrates;

FIG. 3A is a schematic diagram that shows the coating of PMMA on the as-grown sample;

FIG. 3B is a schematic diagram that shows the sample being dried in an ambient condition;

FIG. 3C is a schematic diagram that shows the sample being put into a 30% weight/volume KOH solution;

FIG. 3D is a schematic diagram that shows the PMMA being attached to a thermal tape with a small square window after being separated from the substrate, scooped out and rinsed in DI water;

FIG. 3E is a schematic diagram that shows the aligned-transfer process;

FIG. 3F is a schematic diagram that shows the target substrate being baked on a hotplate;

FIG. 3G is a schematic diagram that shows the target substrate being soaked in acetone;

FIG. 3H is a schematic diagram that represents the transfer of TMD arrays onto arrayed structures;

DETAILED DESCRIPTION OF EXEMPLARY EMBODIMENTS

The following disclosure is presented to provide an illustration of the general principles of the present invention and is not meant to limit, in any way, the inventive concepts contained herein. All terms defined herein should be afforded their broadest possible interpretation, including any implied meanings as dictated by a reading of the specification as well as any words that a person having skill in the art and/or a dictionary, treatise, or similar authority would assign thereto.

Further, it should be noted that, as recited herein, the singular forms "a", "an", and "the" include the plural referents unless otherwise stated. Additionally, the terms "comprises", "comprising", "includes", "including", "has" and the like, when used herein specify that certain features are present in that embodiment; however, this phrase should not be interpreted to preclude the presence or addition of additional steps, operations, features, components, and/or groups thereof.

Aspects of the present invention include a synthesis process of localized TMDs and a transfer process of as grown TMD arrays to an arbitrary substrate. FIGS. 1A-1F are schematic diagrams showing the growth and transfer processes of $MoS_2$ monolayer arrays using patterned $MoO_3$ precursors in accordance with embodiments of the present invention. In this exemplary embodiment, photoresist is spin-coated and patterned on a 90 nm $SiO_2$ substrate (See FIG. 1A) followed by the deposition of 5 nm $MoO_3$ (See FIG. 1B). The $MoO_3$ dot arrays are then formed via a lift-off process (See FIG. 1C). Following CVD, $MoS_2$ arrays are grown on both the source and growth substrates (See FIG. 1D). The $MoS_2$ arrays are transferred onto target substrates (See FIGS. 1E, 1F). Specifically, two substrates are used during the CVD growth, which are prepared separately, with patterned transition metal oxide films deposited on the "source substrate" and a chemical treatment on the bare silicon dioxide "growth substrate" Arrays of dot patterns of 5 nm-thick transition metal oxide film are created on an oxidized silicon wafer, the "source substrate" using a conventional photolithography process followed by a standard lift-off process. The growth substrate is soaked in 30% weight/volume KOH for 10 seconds, in order to increase the surface energy.

Figure 2:
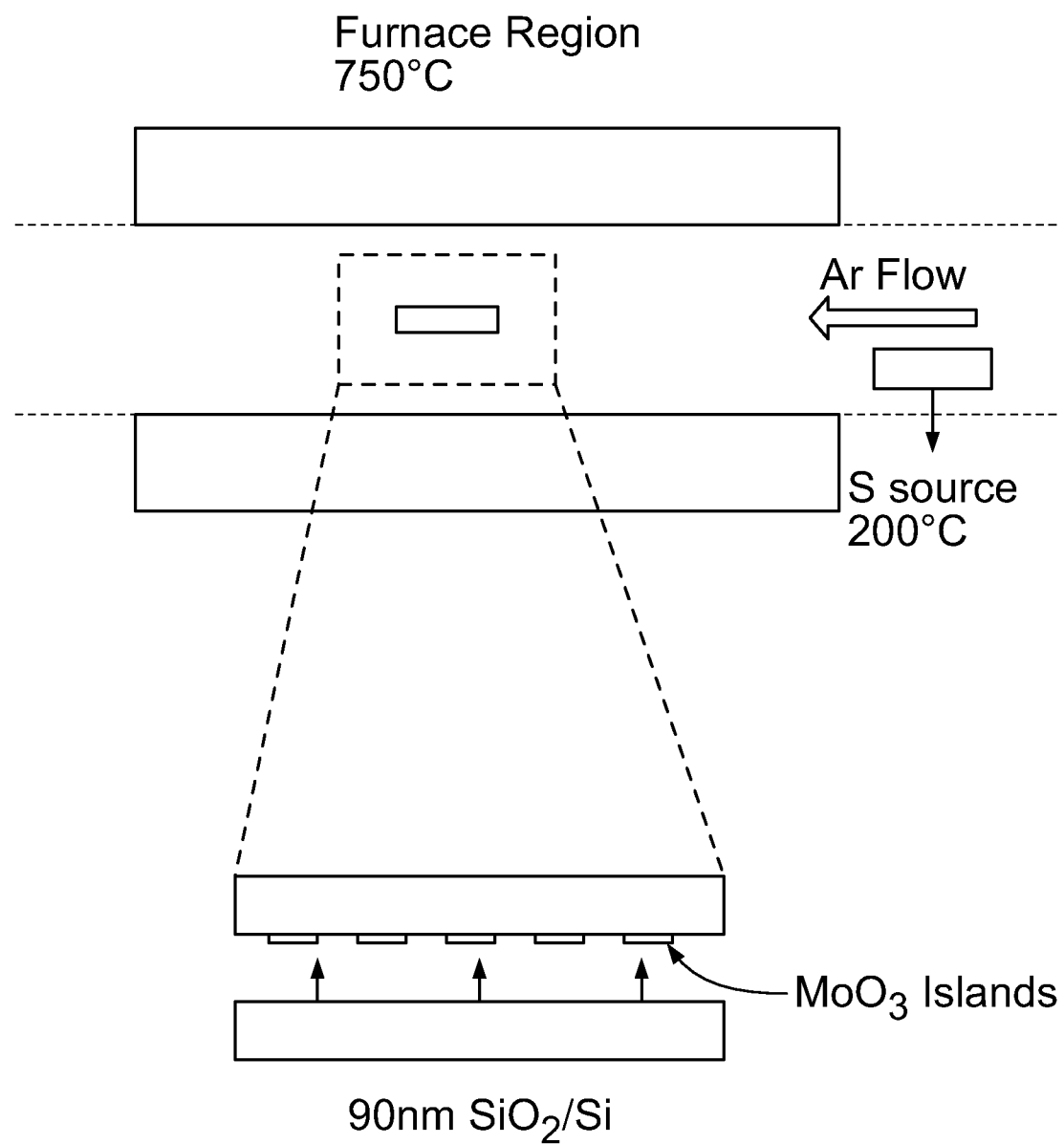
FIG. 2 illustrates the CVD growth setup (FIGS. 1C and 1D): the $MoO_3$ source substrate is placed face-to-face with the growth substrate in the center of the furnace. Gaseous Ar, $H_2$, and S are delivered from upstream.

Referring to FIG. 2, two substrates are used for growth: the substrate with the transition metal precursor is used as the source substrate, and an oxidized silicon substrate is used as the growth substrate. During the growth, the source and growth substrates are in physical contact, face-to-face. By controlling the distance between the alumina boat and the heating zone of the tube furnace, the sulfur in the crucible is fully melted (from solid form to liquid form). The sulfur fully evaporates after around 10-15 minutes at 750° C. The heating element is then turned off to cool by ordinary dissipation to 550° C., at which point the gases are turned off and the furnace opened for a more rapid cooling.

Referring to FIG. 3, during the aligned-transfer process, single crystalline TMD monolayer arrays on an oxidized silicon substrate are coated with a thin layer of Poly(methyl methacrylate) (PMMA) using a dropper. The substrate is left in an ambient condition to dry for 60 min. Then the chip is floated in 30% weight/volume KOH (aq) for 10 min, in which the substrate sinks due to etching of $SiO_2$, leaving the PMMA/TMD layers floating on the KOH solution. The PMMA/TMD is cleaned with DI water and dried with an air blower. The sample is then attached to thermal tape with a small square window. The window in the non-transparent thermal tape aids the alignment process and provides a full exposure of PMMA to acetone during the polymer removal process. The thermal tape with PMMA/TMD is attached to a glass slide using double-side tape. The glass slide is mounted on a x, y, z, rotation micromanipulator. The target substrate with the pre-fabricated microstructures is placed on the microscope stage. Once the microstructure is identified under the microscope, the desired TMDs are aligned to the target locations using the micromanipulator. The glass slide/thermal tape/PMMA/TMD is carefully placed in contact with the microstructure by lowering it while observing in a microscope, at which point the thermal tape fixes the positions of the PMMA/TMD against the target substrate. The tape/PMMA/TMD/target is unmounted and baked on hot plate at 90° C. for 1 min and then soaked in acetone at 50° C. to remove the tape and PMMA. In this manner, TMD arrays are transferred onto arrayed structures.

Preliminary Results

Figure 4A:
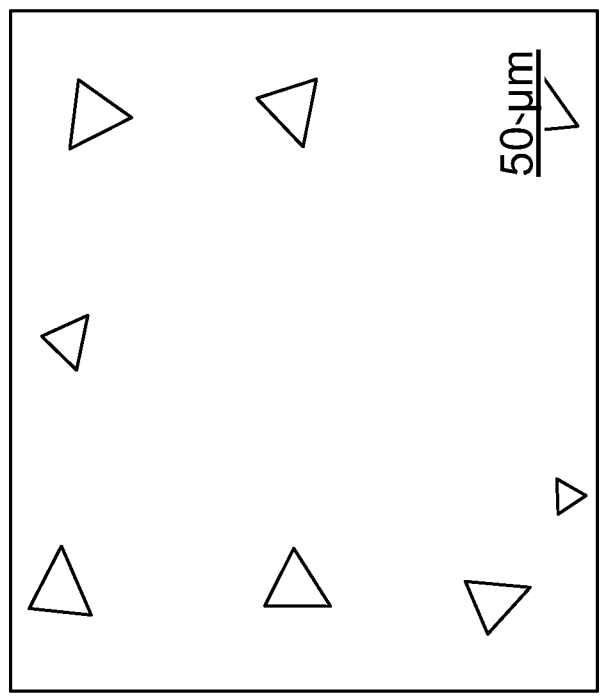
FIG. 4A shows $MoS_2$ monolayer arrays grown on the growth substrate.

Referring to FIG. 4A, small (≤20 μm) patterns of transition metal oxide layers tend to enhance the growth of predominantly single-crystalline islands, while large (≥40 μm) patterns are found to facilitate the growth of continuous polycrystalline layers.

Figure 4B:
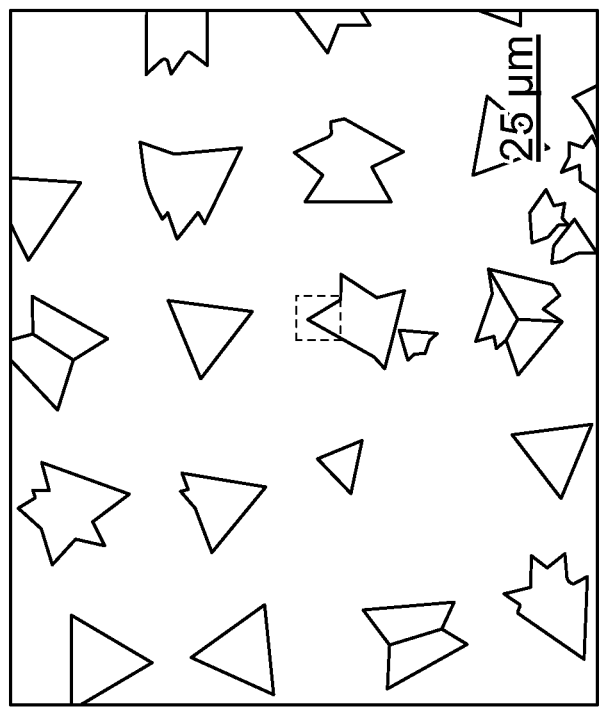
FIG. 4B shows arrays of $MoS_2$ grown using 10 μm diameter $MoO_3$ dot patterns, near the center of the growth substrate.

Referring to FIG. 4B, with 20 μm diameter $MoO_3$ dots on the source substrate, uniform monolayers of single crystalline $MoS_2$ arrays were formed on the growth substrate.

Figure 4C:
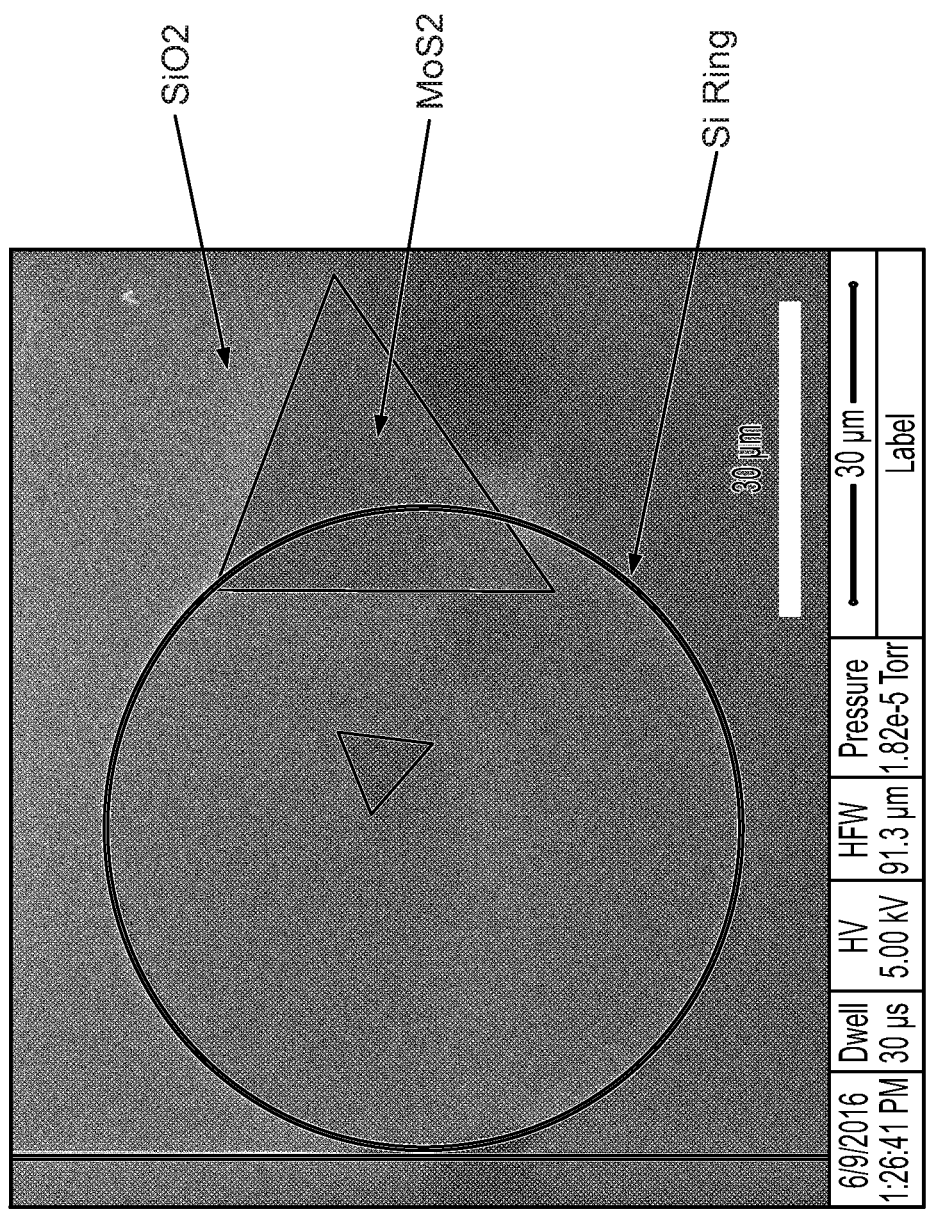
FIG. 4C shows arrays of single crystalline $MoS_2$ monolayers, grown using 20 μm diameter $MoO_3$ dot patterns on the source substrate.

Referring to FIG. 4C, in order to maintain the integrity of $MoS_2$ and protect the microstructure during the transfer process, a wet transfer process along with a thermal tape as a stamping carrier for the PMMA/$MoS_2$ layer was used during alignment. Localized $MoS_2$ single crystalline monolayer flake was successfully transferred onto an exemplary microstructure. The structure is very fragile, and has a height and width both of ~500 nm.

Supplemental details and further experimental verification are presented in the publication by Xiaotian Wang et al., titled "Location-Specific Growth and Transfer of Arrayed MoS2 Monolayers with Controllable Size," 2D Materials, Vol. 4(2), April 2017 [online], <URL: https://www.researchgate.net/publication/316250656_Location-Specific_Growth_ and_Transfer_of_Arrayed_MoS2_Monolayers_with_Controllable_Size> <DOI:10.1088/2053-1583/aa6e69>, the entire disclosure of which is incorporated herein by reference and is made part of the present disclosure.

It will be understood that the embodiments described herein are merely exemplary and that a person skilled in the art may make many variations and modifications without departing from the spirit and scope of the invention. All such variations and modifications are intended to be included within the scope of the invention.

We claim:

1. A method for growing patterned transition metal dichalcogenides on a substrate, said method comprising the steps of:
   providing a source substrate having a first surface comprising a patterned film;
   providing a growth substrate that is void of a patterned film;
   soaking said growth substrate in a potassium hydroxide solution, for a length of time sufficient to allow said growth substrate to undergo an increase in surface energy;
   placing said source substrate and said growth substrate face-to-face after said soaking step to thereby form a composite structure comprising said source substrate and said growth substrate; and
   subjecting said composite structure to a chemical vapor deposition process to thereby create a first transition metal dichalcogenide layer on said growth substrate and a second transition metal dichalcogenide layer on said source substrate, both said first transition metal dichalcogenide layer and said second transition metal dichalcogenide layer being patterned in accordance with said patterned film.

2. The method of claim 1, wherein said step of providing a source substrate comprises the steps of providing a base substrate; and spin-coating photoresist on said base substrate to form a patterned array on said source substrate.

3. The method of claim 2 wherein said step of providing a source substrate further comprises the step of performing photolithography on said source substrate after forming said spin-coating step.

4. The method of claim 3, wherein said step of providing a source substrate further comprises the step of performing a lift-off procedure on said patterned array, following said step of performing photolithography, whereby said patterned array becomes said patterned film.

5. The method of claim 1, wherein said patterned film comprises a transition metal oxide.

6. The method of claim 5, wherein said transition metal oxide comprises molybdenum trioxide.

7. The method of claim 1, wherein said growth substrate comprises silicon dioxide.

8. The method of claim 1, wherein said source substrate comprises silicon dioxide.

9. The method of claim 1, wherein said first transition metal dichalcogenide layer and said second transition metal dichalcogenide layer each comprise molybdenum disulfide.

10. The method of claim 1, wherein performing chemical vapor deposition further comprises delivering heated argon, hydrogen and sulfur gases to said growth substrate and said source substrate.

11. The method of claim 1, wherein said KOH solution is 30% weight/volume KOH.

12. A process for transferring transition metal dichalcogenide arrays onto a target substrate, said process comprising the steps of:
providing a target substrate;
obtaining a transfer substrate having a film coating;
coating said transfer substrate with Poly(methylmetharcrylate) to form a chip;
allowing said chip to dry;
floating said chip in aqueous potassium hydroxide solution;
retrieving a film product from said solution;
rinsing said film product with deionized water;
drying said film product;
attaching said film product to a thermal tape;
aligning said film product with a desired microstructure of said target substrate;
adhering said thermal tape to said target substrate;
baking said target substrate; and
soaking said target substrate in acetone, thereby removing said thermal tape and said Poly(methylmetharcrylate).

13. The method of claim 12, wherein said obtaining step comprises the steps of:
providing a source substrate having a first surface comprising a patterned film;
providing a growth substrate that is void of a patterned film;
soaking said growth substrate in a potassium hydroxide solution, for a length of time sufficient to allow said growth substrate to undergo an increase in surface energy;
placing said source substrate and said growth substrate face-to-face after said soaking step to thereby form a composite structure comprising said source substrate and said growth substrate; and
subjecting said composite structure to a chemical vapor deposition process to thereby create a first transition metal dichalcogenide layer on said growth substrate and a second transition metal dichalcogenide layer on said source substrate, both said first transition metal dichalcogenide layer and said second transition metal dichalcogenide layer being patterned in accordance with said patterned film.

14. The method of claim 12 wherein said thermal tape has a window to aid alignment.

15. The method of claim 12, wherein said target substrate is baked on a hot plate for 1 minute at 90° C.

16. The method of claim 12, wherein said soaking step is performed at a temperature of 50° C.

17. The method of claim 12, wherein said film coating comprises molybdenum disulfide.

18. The method of claim 12, wherein said transfer substrate comprises silicon dioxide.

19. The method of claim 12, wherein said aligning step and said adhering step are done through micromanipulation means.

20. The method of claim 12, wherein said film coating comprises a transition metal dichalcogenide layer.

* * * * *